(12) United States Patent
Enright et al.

(10) Patent No.: US 10,200,055 B2
(45) Date of Patent: Feb. 5, 2019

(54) GLITCH CHARACTERIZATION IN DIGITAL-TO-ANALOG CONVERSION

(71) Applicant: Analog Devices Global, Hamilton (BM)

(72) Inventors: Peter Enright, Castleconnell (IE); Martina Mincica, Nenagh (IE); Fergus Downey, Raheen (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/863,313

(22) Filed: Jan. 5, 2018

(65) Prior Publication Data

US 2018/0198459 A1    Jul. 12, 2018

Related U.S. Application Data

(60) Provisional application No. 62/445,209, filed on Jan. 11, 2017.

(51) Int. Cl.
*H03M 1/66* (2006.01)
*H03M 1/08* (2006.01)
*H03M 1/10* (2006.01)

(52) U.S. Cl.
CPC ........ *H03M 1/0863* (2013.01); *H03M 1/1009* (2013.01)

(58) Field of Classification Search
CPC .................. H03M 1/0863; H03M 1/1009
USPC ......................... 341/118, 120, 144
See application file for complete search history.

(56) References Cited

U.S. PATENT DOCUMENTS

| | | | | |
|---|---|---|---|---|
| 5,521,556 A | * | 5/1996 | O'Shaughnessy ... | H03K 3/0315 331/1 R |
| 5,625,360 A | * | 4/1997 | Garrity ............... | H03M 1/0863 341/144 |
| 6,741,195 B1 | * | 5/2004 | Cho .................... | H03M 1/0872 323/315 |
| 6,795,008 B1 | * | 9/2004 | Wang ............... | H03K 17/04106 341/136 |
| 7,215,271 B2 | * | 5/2007 | Ido ..................... | H03M 1/0863 341/144 |
| 8,089,380 B2 | | 1/2012 | McLachlan et al. | |

(Continued)

OTHER PUBLICATIONS

"Deglitching Techniques for High-Voltage R-2R DACs", maxim integrated—Application Note 583, (May 1, 2001), 7 pgs.

(Continued)

*Primary Examiner* — Brian Young
(74) *Attorney, Agent, or Firm* — Schwegman Lundberg & Woessner, P.A.

(57) ABSTRACT

Techniques and related circuits are disclosed and can be used to characterize glitch performance of a digital-to-analog (DAC) converter circuit in a rapid and repeatable manner, such as for use in providing an alternating current (AC) glitch value specification. A relationship can exist between a glitch-induced DAC output offset value and a DAC circuit input event rate. A relationship between the event rate (e.g., update rate) and the DAC output offset can be used to predict an offset value based at least in part on update rate or to estimate a corresponding glitch impulse area. In particular, a value representing glitch impulse area can be obtained by use of a hardware integration circuit without requiring use of a digitized time-series of glitch event waveforms.

29 Claims, 14 Drawing Sheets

(56) References Cited

U.S. PATENT DOCUMENTS

| | | | |
|---|---|---|---|
| 8,896,472 B2* | 11/2014 | Seo ..................... | H03M 1/785 341/145 |
| 9,048,864 B2* | 6/2015 | Kabir ................... | H03M 1/661 |
| 9,136,866 B2 | 9/2015 | Downey et al. | |
| 9,178,524 B1* | 11/2015 | Lee .................... | H03M 1/0612 |

OTHER PUBLICATIONS

Sauceda, Matthew, "Sample & Hold Glitch Reduction for Precision Outputs Reference Design", Texas Instruments, (Jul. 2015), 1-37.

Usach, Miguel, et al., "Second-Order Effects to Consider for Continuous Precision DAC Updates", Analog Devices AN-1444, (Jan. 30, 2017), 6 pgs.

"Chinese Application Serial No. 201810033429.9, Office Action dated Feb. 27, 2018", 1 pg.

\* cited by examiner

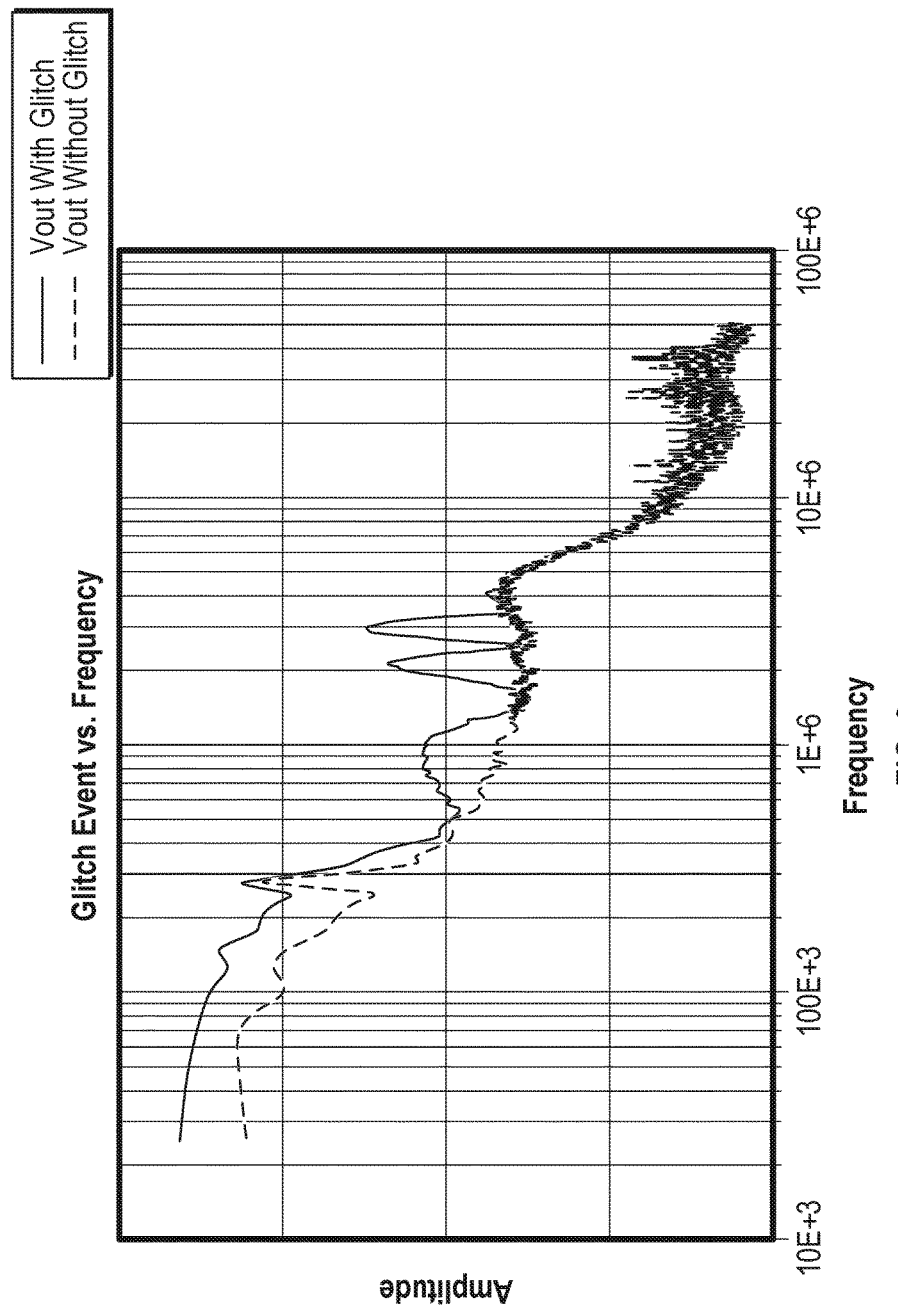

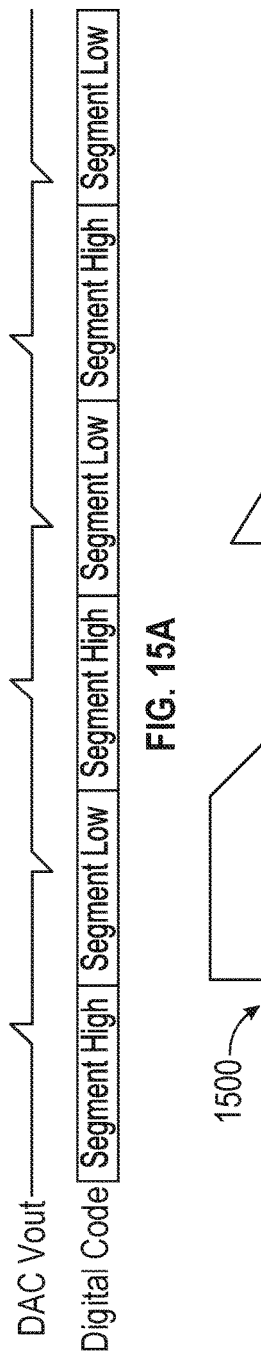
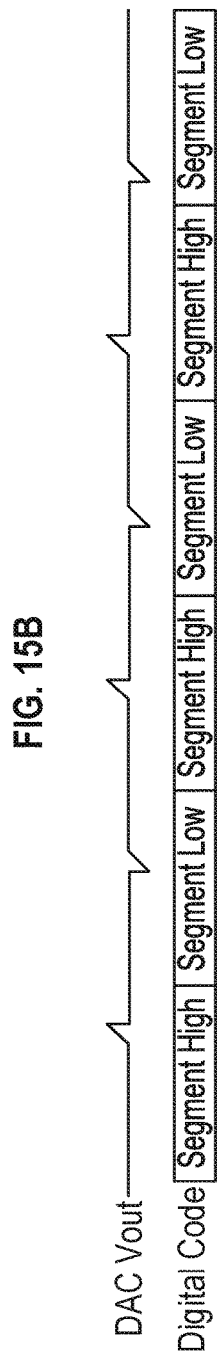
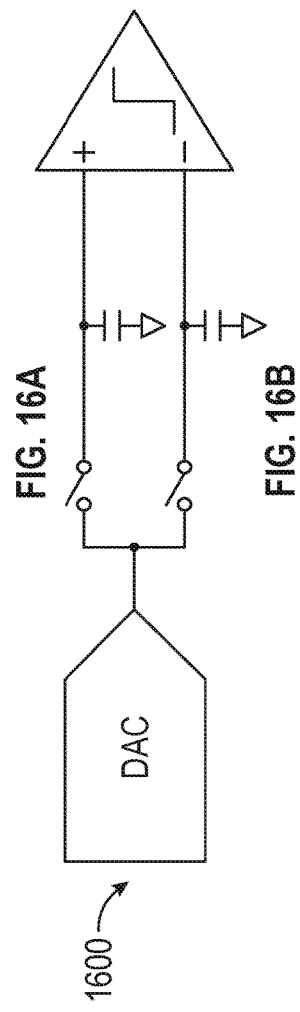
FIG. 15A
FIG. 15B
FIG. 16A
FIG. 16B

GLITCH CHARACTERIZATION IN DIGITAL-TO-ANALOG CONVERSION

CLAIM OF PRIORITY

This patent application claims the benefit of priority of Enright et al., U.S. Provisional Patent Application Ser. No. 62/445,209 entitled "GLITCH CHARACTERIZATION IN DIGITAL-TO-ANALOG CONVERSION," filed on Jan. 11, 2017, which is hereby incorporated by reference herein in its entirety.

FIELD OF THE DISCLOSURE

This document pertains generally, but not by way of limitation, to digital-to-analog conversion, and more specifically to glitch phenomena in the operation of digital-to-analog converter (DAC) circuits.

BACKGROUND

DAC circuits may exhibit dynamic behavior causing transient output impulses, and such impulses can be referred to as glitch phenomena. Such glitch phenomena can be related to programmed changes in output level (e.g., DAC output code register changes), sample-and-hold circuit effects, or digital feedthrough where digital accessing of DAC circuit inputs causes or contributes to a transient output impulse at the DAC output (with or without a register write corresponding to an output level change).

SUMMARY OF THE DISCLOSURE

The present inventors have developed techniques and related circuits that can be used to characterize glitch performance in a rapid and repeatable manner, such as for use in providing an alternating current (AC) maximum glitch value specification. The present inventors have also, among other things, identified a relationship between a glitch-induced DAC output offset value and DAC circuit input event rate. The relationship between the event rate (e.g., update rate) and the DAC output offset can be used to predict an offset value based at least in part on update rate. In particular, a value representing glitch impulse area can be obtained by use of a hardware integration circuit.

A specified time duration can be used for integration of a single glitch event or multiple replicate glitch events. Such integrated events can be compared to an equivalent replicate event, or corresponding events, where a glitch is not present or where such a glitch is modified by a known quantity. As an illustrative example, a difference in integrated areas can be determined between a DAC register write without update (e.g., corresponding to digital feedthrough or sample-and-hold capacitance behavior, if triggered) and a DAC register write with update (including a contribution corresponding to the output update). If a hardware integration approach is used, the measurement of the glitch area can be related to a DC measurement, making such an approach repeatable and well-suited for use for on-chip measurement of glitch area, or for use in automated test equipment (ATE) environments.

In an example, a method for characterizing transient behavior associated with a digital-to-analog converter (DAC) circuit can include generating a series of DAC circuit input events resulting in respective transients at an output of the DAC circuit, along with summing contributions from the respective transients to determine a DAC circuit output offset value representative of the transients, such as using an integrator circuit. The method can include generating the series of events at a specified repetition rate, such as resulting in a DAC circuit output offset value corresponding to the specified repetition rate. The method can include estimating a representative transient glitch area value using the output offset value. The series of events can include a series of DAC circuit register writes.

In an example, a circuit or system can include a DAC circuit. Generally, a DAC circuit can include an analog output, and a digital input configured to trigger events resulting in respective transients at the analog output. Such triggering can include receiving a series of digital input events or generating such events. The DAC circuit can be coupled to an integrator circuit or can include such a circuit configured to sum contributions from the respective transients to determine a DAC circuit output offset value representative of the transients. The DAC circuit can include an offset compensation circuit configured to apply an offset compensation to the analog output corresponding to the determined DAC circuit output offset value.

The subject matter described in this document can be applied in examples where, for example, a DAC circuit is characterized using automated test equipment (ATE) implementing circuits or techniques described herein, or, for example, where the DAC circuit includes embedded measurement capability, such as included as a portion of an integrated circuit comprising the DAC circuit and implementing circuits or techniques described herein.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 9 illustrates generally plots of frequency spectra associated a presence and absence of glitch events.

FIG. 15A illustrates generally a sequence of states that can be used recover positive-going and negative-going glitch area contributions, such as corresponding to the two states shown illustratively in FIG. 14A and FIG. 14B, and a measurement configuration including a comparator circuit is shown illustratively in FIG. 15B.

FIG. 16A illustrates generally a sequence of states that can be used recover positive-going and negative-going glitch area contributions, such as corresponding to the two states shown illustratively in FIG. 14A and FIG. 14B, and a differential measurement configuration including a comparator circuit is shown illustratively in FIG. 16B.

DETAILED DESCRIPTION

Glitch impulse behavior of digital-to-analog (DAC) conversion circuits can be difficult to simulate because such behavior can be caused by a variety of mechanisms. Such mechanisms can include parasitic effects associated with a large number of internal device nodes and their related interactions. Such behavior is also generally code-value dependent, in that the glitch behavior may depend on a specific digital code value corresponding to an output level, or the transition between particular code values. Charge injection effects associated with sample-and-hold behavior can also be difficult to simulate. Simulators generally estimate channel charge flow direction and accordingly the charge injection is not generally modeled accurately. In one approach, charge injection effects can be reduced or canceled through selection of the circuit topology and design parameters, but the effectiveness of such approaches can be limited. Accordingly, an assessment of glitch performance and charge injection impacts is generally made using actual measurements.

Data sheet specifications for DAC circuits may generally refer to glitch performance in terms of a "typical" performance value. Such a performance value can include an area of a glitch impulse, such as specified in units of nanovolt-seconds (nV-s). In one approach, such a "typical" value is specified from measurement of a single least-significant-bit (1-LSB) transition of the DAC circuit corresponding to a major carry transition, such as a transition from an input code value of 0x7FFF to a value of 0x8000 for a 16-bit DAC circuit, as an illustrative example. It is generally believed that such a code transition would involve respective transitions for most of the DAC circuit internal switches, though in practice this assumption is not necessarily true.

In one approach, the "typical" performance value can be obtained such as using a high-accuracy digitizer in a bench setup. A single-LSB output change can be captured using a digitizer to obtain a time-series representation of a transient waveform, such as synchronized with the digital inputs to the DAC circuit. A specified count of replicate waveforms can be obtained and averaged, such as to reduce noise. A difference between a measured waveform and an idealized output line can be integrated in software from the digitized time-series over a specified time duration, such as a duration specified interactively at the outset of testing. The present inventors have recognized that such an approach can have limitations, such as being impractical for use in characterizing a large count of devices rapidly in a production setting. Also, if a restricted sample of devices or a restricted group of test cases is used for determining the "typical" performance value, the production devices may exhibit glitch performance having maximum or worst-case values that deviate from a published "typical" performance value.

Figure 1:
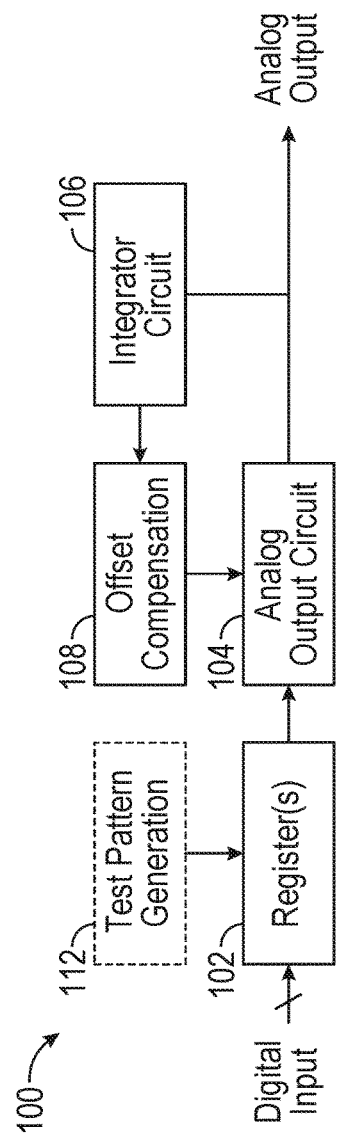
FIG. 1 illustrates generally an example comprising an electronic circuit 100, such as can be included as a portion of an integrated circuit. In the example of FIG. 1, the electronic circuit 100 can be a digital-to-analog (DAC) converter circuit, such as having a digital input (e.g., implemented as a serial interface or parallel bus) such as coupled to control circuitry including one or more registers

FIG. 1 illustrates generally an example comprising an electronic circuit 100, such as can be included as a portion of an integrated circuit. The electronic circuit 100 can represent a portion of an integrated circuit including a digital-to-analog (DAC) converter circuit, such as including a control circuit or other logic comprising hardware registers 102, where the hardware registers 102 are configured to receive a digital input. The digital input can be either serial or parallel, such as conforming to one or more interface standards (e.g., inter-integrated circuit ($i^2c$), serial peripheral interface (SPI), or System Management Bus (SMbus), as illustrative examples). The hardware registers 102 can be used to configure an analog output circuit 104.

The analog output circuit 104 can include one or more DAC circuit architectures, such as having segmentation or redundancy. For example, in a segmented design, the analog output circuit 104 can include a first sub-DAC topology covering a first portion of an input range (such as corresponding to one or more bits within a most-significant-bit (MSB) block), and a second sub-DAC topology covering a second portion of an input range (such as corresponding to one or more bits within a least-significant-bit (LSB) block). Examples of such topologies include thermometer or binary weighting schemes, and current-mode, or charge-scaling architectures, as illustrative examples. Examples mentioned elsewhere can include use of an R2R ladder scheme, such as having redundant branches or elements.

In the example of FIG. 1, an integrator circuit 106 can be used, such as provided by an external test instrument, or provided by circuitry internal to an integrated circuit. The integrator circuit 106 can be an analog hardware circuit that sums or otherwise stores an aggregated signal representing a contribution from one or more output signals from the analog output of the electronic circuit 100. For example, the integrator circuit 106 can be used to sum contributions from a series of transients at the analog output, such as to provide a DC value representing an output offset corresponding to the contributions from the AC transients at the analog output. As mentioned above and elsewhere herein, use of the hardware integrator circuit 106 does not require digitizing the analog output or obtaining a discrete-valued time-series of samples corresponding to AC output transients at the analog output. An offset value obtained by the integrator circuit 106 can be provided as a measured value characterizing the glitch performance of the electronic circuit 100, or such a value can be provided in digital or analog form to an offset compensation circuit 108. For example, according to various examples, the integrator circuit 106 can provide an analog voltage value to an offset compensation circuit 108 comprising a comparator circuit or other detector.

The offset compensation circuit 108 can then be coupled to the analog output circuit 104, such as to control the analog output circuit 104 to add or subtract a DC contribution to the analog output to compensate for the measured offset. Such a calibration can be performed across multiple ranges of code values, code-value transitions, or in response to other parameters such as an output update frequency (or corresponding update interval). As mentioned elsewhere, such compensation can include controlling the analog output circuit 104 to add or subtract one or more counts of single-LSB or fractional-LSB branches within the analog output circuit 104. In this manner, an integrated circuit including the elements shown in FIG. 1 can perform a self-calibration or self-characterization. Alternatively, or in addition, the integrator circuit 106 and offset compensation circuit 108 can be provided by automated test equipment, and trim values or other calibration information can be programmed during production testing or in the field. In an example, a test pattern generation circuit 112 can be included or can be coupled to the electronic circuit.

The test pattern generation circuit 112 can generate a sequence of events either through the digital input or internally through coupling to the registers 102 of the electronic circuit 100. A sequence of measurement or calibration operations can be performed. In an example, as mentioned elsewhere herein, characterization or calibration relating to linearity or accuracy can provide information that can also be used to perform glitch characterization, such as by subtracting a measured DC contribution relating to a code-value change in output level from a measured DC offset value including contributions from glitch behavior and the output level change, thus isolating an effect of glitch behavior. Further discussion and examples below describe apparatus and techniques, such as can be used with the electronic circuit 100 of FIG. 1, or included as a portion of a system or circuit of which a portion is shown in FIG. 1.

Figure 2:
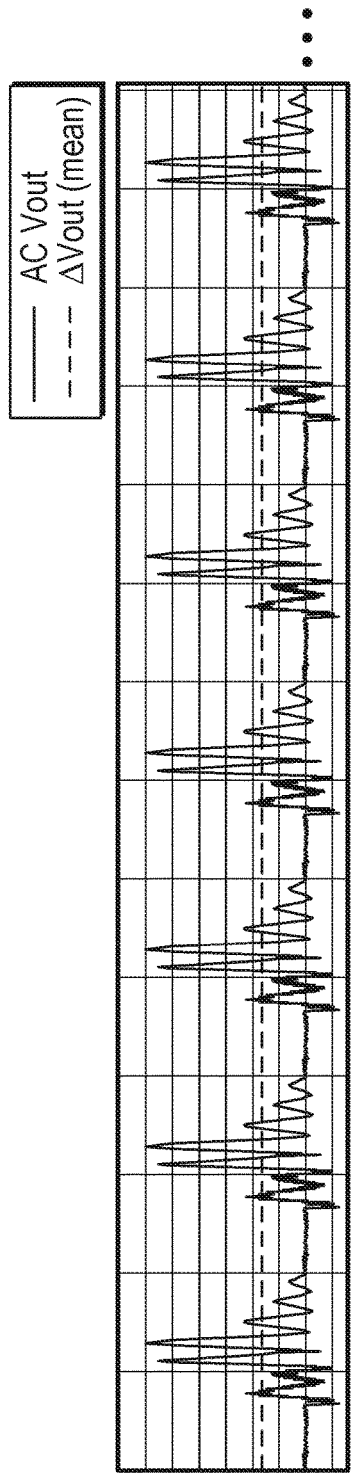
FIG. 2 illustrates generally an illustrative example comprising a chain of glitch impulse events at an output of a digital-to-analog (DAC) converter circuit (the output labeled "AC Vout").

FIG. 2 illustrates generally an illustrative example comprising a chain of glitch impulse events at an output of a digital-to-analog (DAC) converter circuit (the output labeled "AC Vout"). A glitch area associated with a repeating write operation integrates on a capacitor (internal to the DAC circuit or located externally), a downstream circuit element will see an offset (labeled ΔVout (mean)). The events shown in FIG. 2 can include a series of digital input events, such as including corresponding output updates, or such events can cause a feedthrough effect, such as mentioned in other examples, where an output level update is not commanded but a transient impulse still occurs.

Figure 3A:
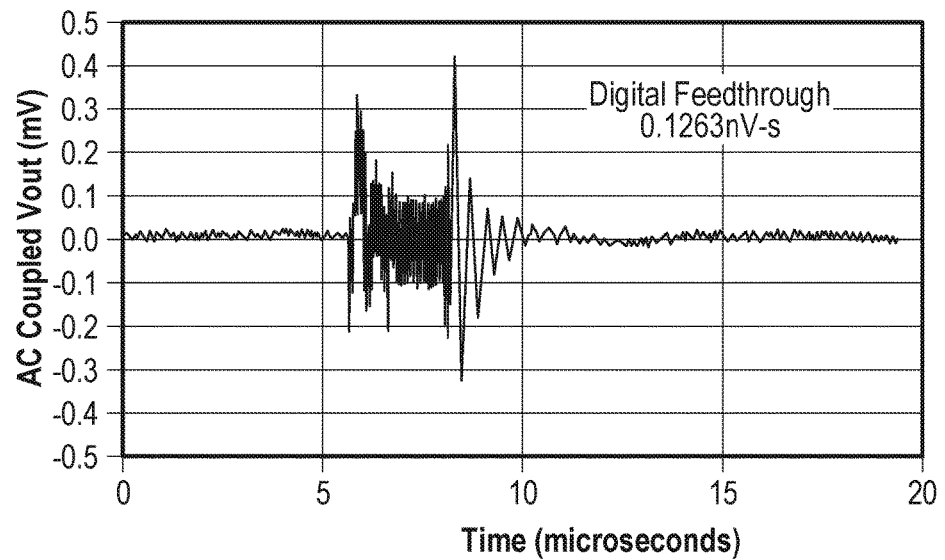
FIG. 3A and FIG. 3B illustrate generally respective illustrative examples of measured AC-coupled waveforms of a DAC circuit glitch impulse event corresponding to a digital feedthrough effect (FIG. 2A) and a glitch impulse event associated with an output update (FIG. 2B), such as including a contribution from a sample-and-hold circuit.
Figure 3B:
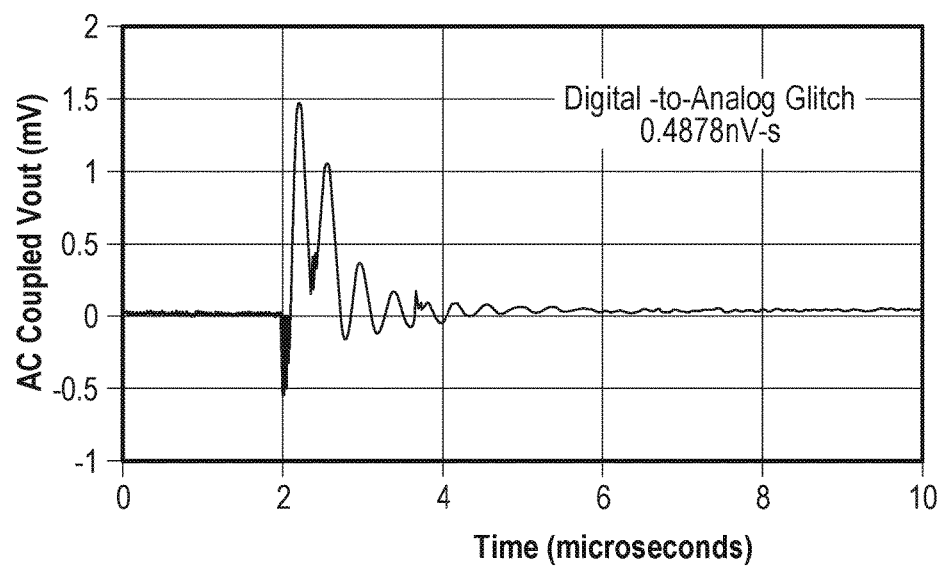

FIG. 3A and FIG. 3B illustrate generally respective illustrative examples of measured AC-coupled waveforms of a DAC circuit glitch impulse event corresponding to a digital feedthrough effect (FIG. 3A) and a glitch impulse event associated with an output update (FIG. 3B), such as including a contribution from a sample-and-hold circuit. The waveforms in FIG. 3A and FIG. 3B can be obtained from a single glitch event, or via averaging a chain of glitch events. For purposes of separating effects of an output change from effects associated with digital feedthrough, a delay to updating the DAC circuit output can be forced. Other techniques, such as described below, can be used to extract information about the feedthrough and DAC output change effects, independently.

Figure 4A:
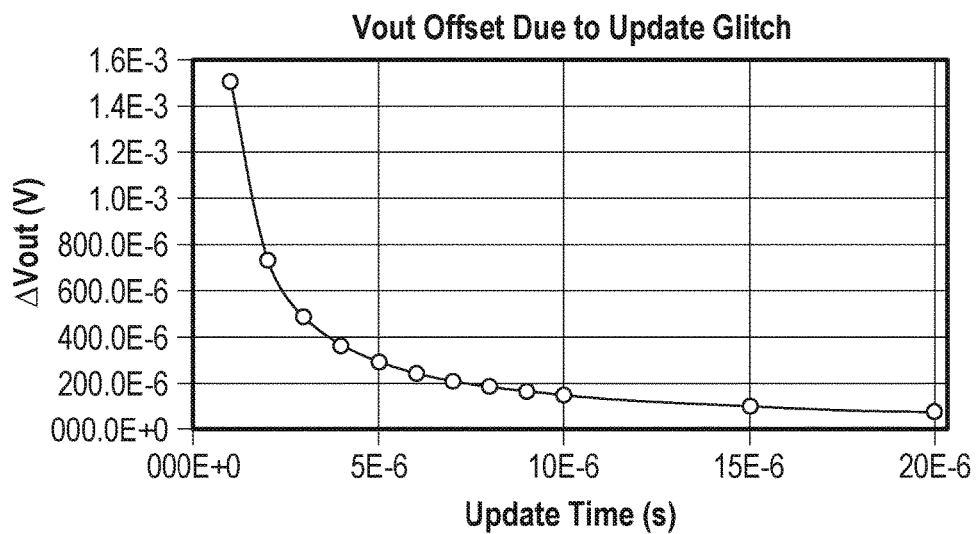
FIG. 4A and FIG. 4B illustrate generally respective examples of measured DAC circuit output offsets as a function of update interval (labeled "update time") in FIG. 4A, and update rate (labeled "update frequency") in FIG. 4B.
Figure 4B:
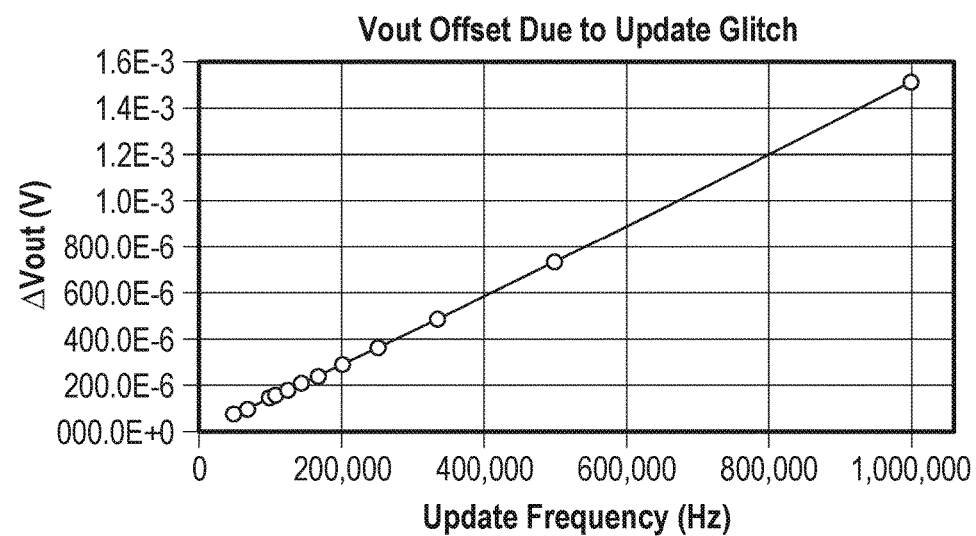

FIG. 4A and FIG. 4B illustrate generally respective examples of measured DAC circuit output offsets as a function of update interval (labeled "update time") in FIG. 4A, and update rate (labeled "update frequency") in FIG. 4B. In particular, FIG. 4B illustrates a linear relationship between observed output DC offset and update rate. The DC offset can be attributed to a combination of sources, such as including glitch area from digital feedthrough, DAC circuit output level change, and sample-and-hold circuit glitch behavior. As mentioned in relation to FIG. 3A and FIG. 3B, if desired, a register write operation can be performed, and an output level change can be separately triggered to reveal digital feedthrough and output change glitch events separately.

Figure 5A:
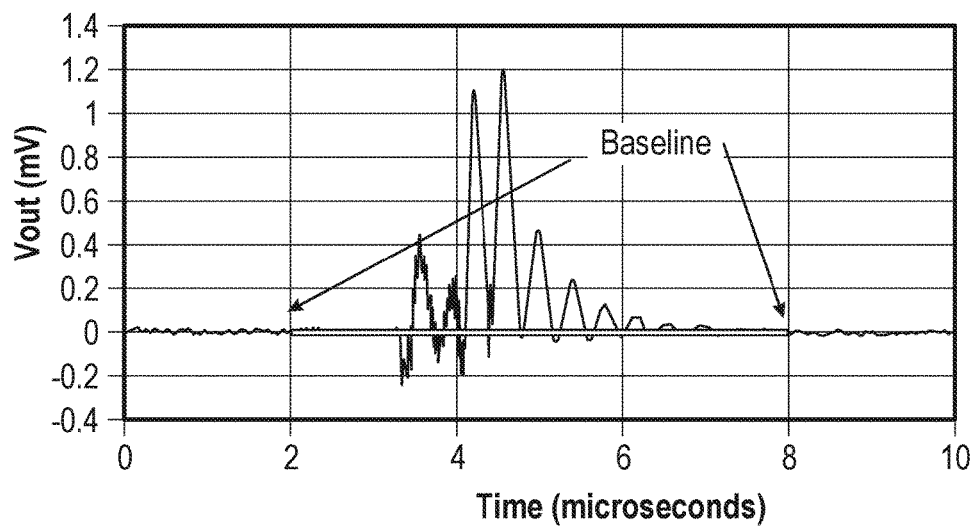
FIG. 5A illustrates generally a representative digitized glitch waveform (or an averaged time series of such waveforms)
Figure 5B:
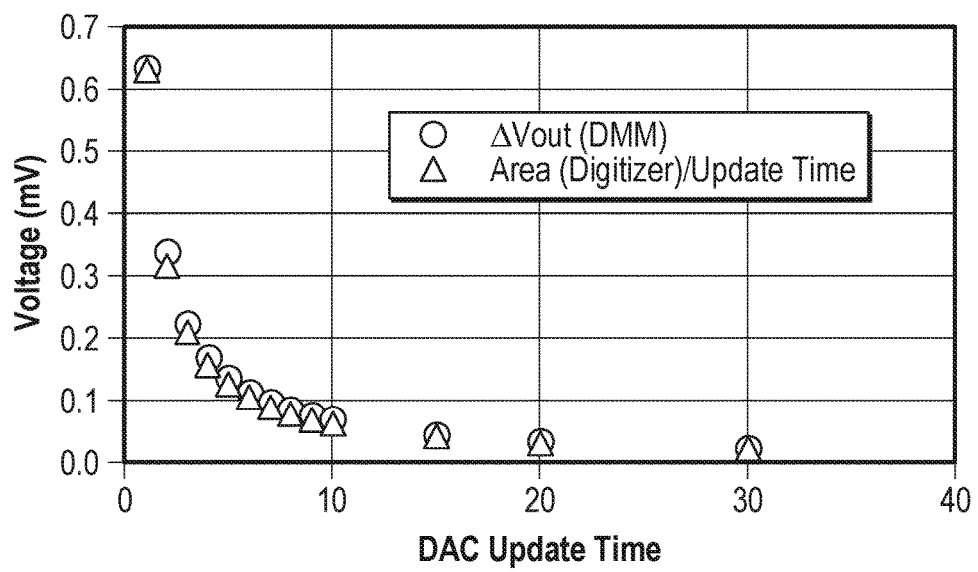
FIG. 5B illustrates generally a comparison between the determined output voltage offset using glitch area divided by update interval, using the digitizer-based approach, versus an approach where an integrating digital multi-meter (DMM) is used (labeled "ΔVout"), showing that an output offset value, "ΔVout" can be used to estimate a glitch area value without requiring digitizing of the glitch waveform.

FIG. 5A illustrates generally a representative digitized glitch waveform (or an averaged time-series of such waveforms), and FIG. 5B illustrates generally a comparison between the determined output voltage offset using glitch area divided by update interval, using the digitizer-based approach, versus an approach where an analog integrator circuit (e.g., an integrating digital multi-meter (DMM)) is used (labeled "ΔVout"), showing that an output offset value, "ΔVout" can be used to estimate a glitch area value without requiring digitizing of the glitch waveform. Generally, an area determination can be made by integrating a representative digitized glitch waveform (or an averaged time series of such waveforms), such as shown illustratively in FIG. 5A, and subtracting a baseline value from the integrated waveform value, such as baseline value corresponding to a level between two "quiet points" outside of the transient glitch event as shown in FIG. 5A.

As shown in FIG. 5B, the present inventors have recognized that a hardware-based integration approach, such as using a DMM or integrated circuit including a hardware-based integrator on-chip, provides output voltage offset estimates that map to corresponding offsets predicted by the digitizer-based approach. In this manner, a glitch area can be estimated without requiring a direct digitizer-based method of measuring glitch area. Glitch area can vary from device-to-device, from channel-to-channel within a device, and from code-to-code within a device or channel. Investigation across DAC circuit codes shows that a hardware-based integration approach such as using a DMM, and its corresponding offset value, reliably maps to the glitch area values determined using a digitizer-based approach, across a broad range of operating parameters or conditions. As an example, a glitch area can be estimated by multiplying a measured offset value by the update interval, $T_{update}$ (e.g., a reciprocal of an update repetition rate) to provide a glitch area estimate in terms of volt-seconds, nanovolt-seconds, or other units. For improved accuracy, a measured or theoretically-estimated calibration constant can be used to scale the resulting $\Delta Vout \cdot T_{update}$ product.

Figure 6:
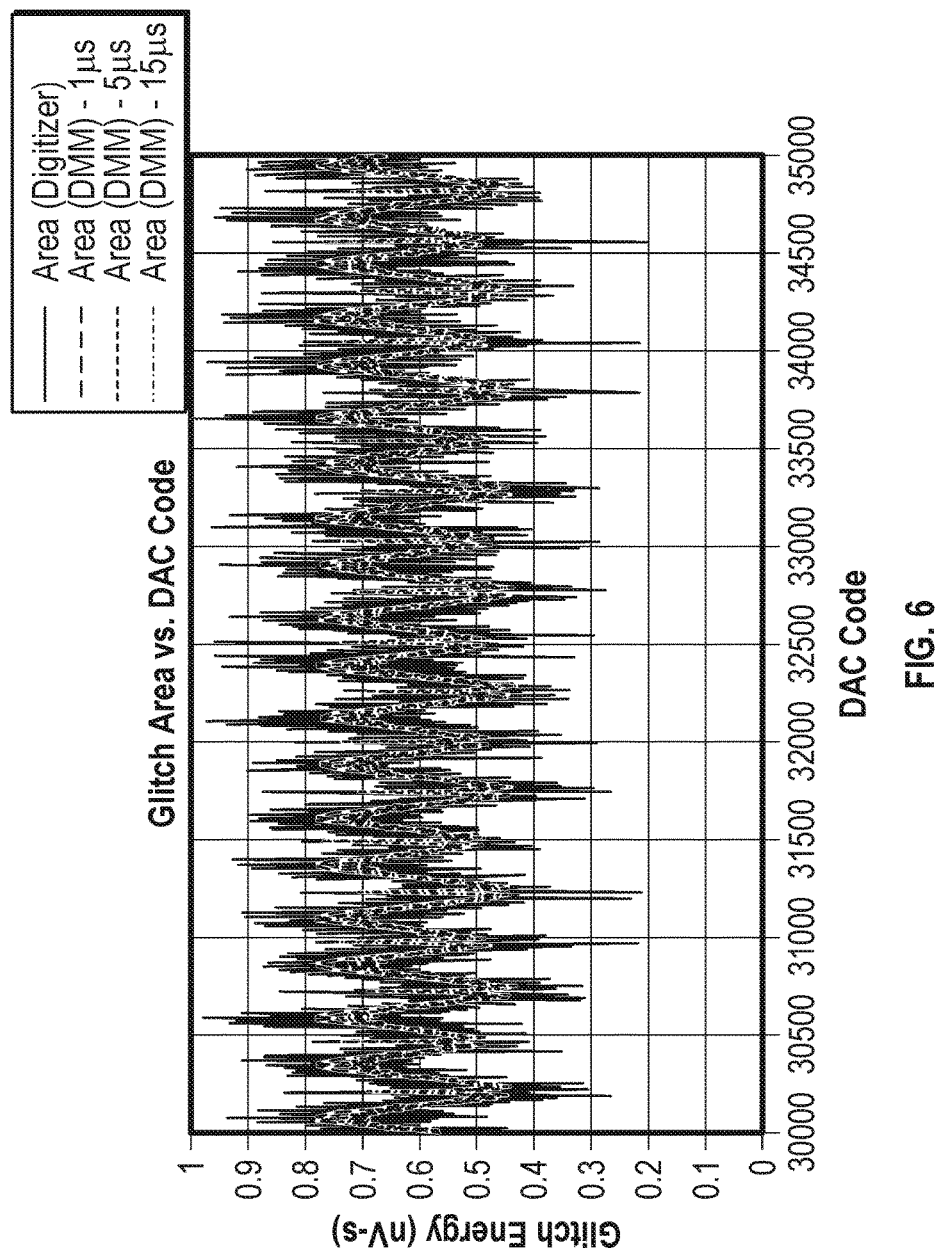
FIG. 6 illustrates generally various illustrative examples of glitch area measured with a digitizer as compared with glitch areas calculated from an offset measured with a DMM, including different cases showing different DAC update intervals.
Figure 7:
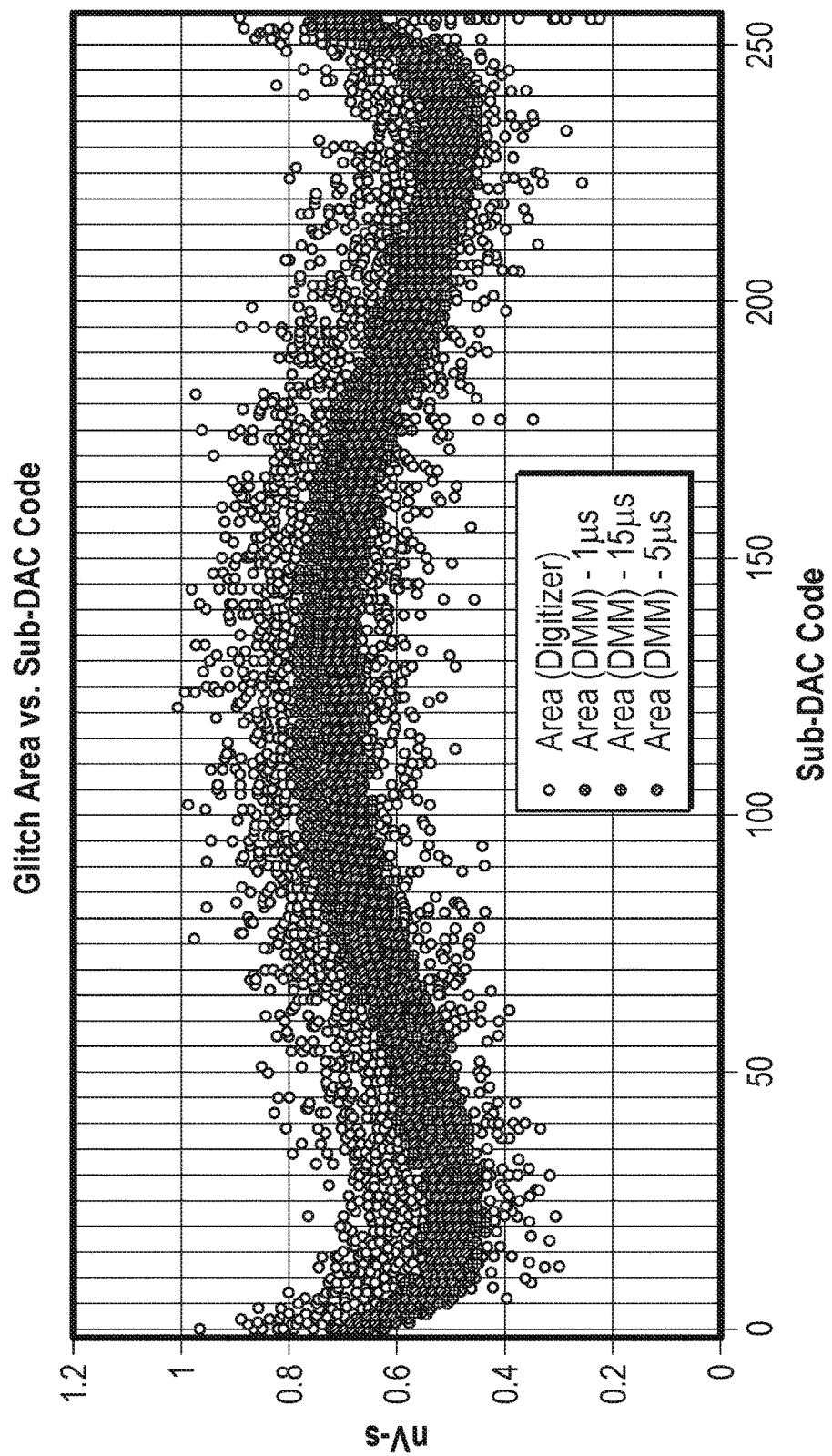
FIG. 7 illustrates generally an example having the same data as FIG. 6, but re-mapped according to the equivalent sub-DAC transition corresponding to a 1LSB code change that is being assessed.

FIG. 6 illustrates generally various illustrative examples of glitch area measured with a digitizer as compared with glitch areas calculated from an offset measured with a. DMM, including different cases showing different DAC update intervals (e.g., update repetition rates), and FIG. 7 illustrates generally an example having the same data as FIG. 6, but re-mapped according to the equivalent sub-DAC transition corresponding to a 1LSB code change that is being assessed. In FIG. 6, a glitch area measured with a digitizer is compared with a glitch area calculated from an offset measured with a DMM, including different cases showing different DAC update intervals (e.g., 1 microsecond, 5 microseconds, and 15 microseconds), and measurements are obtained in each cases for codes having a 1LSB step in a specified range of codes (e.g., code value 30000 to code value 50000). FIG. 7 shows the same data from FIG. 6, but re-mapped according to the equivalent sub-DAC transition corresponding to the single-LSB code change that is being assessed.

The DMM-estimated glitch areas show less noise than corresponding digitizer-estimated values at least in part because an integration duration of 20 milliseconds (ms), used by the DMM, can effectively provide aggregation of a significant number of glitch events, whereas the digitizer-based approach in this example used averaging from 100 events or less, which represents a count of events that is far lower than a count encompassed by the 20 ms integration duration. This illustrates generally that a digitizer-based approach involving calculation of glitch area from a time series can present challenges. In order to achieve an accuracy or precision comparable to the integration-based approach, a very long time-series record would be used (if even feasible), and resulting averaging or other operations would be significantly more time consuming as compared to the integration approach.

Figure 8A:
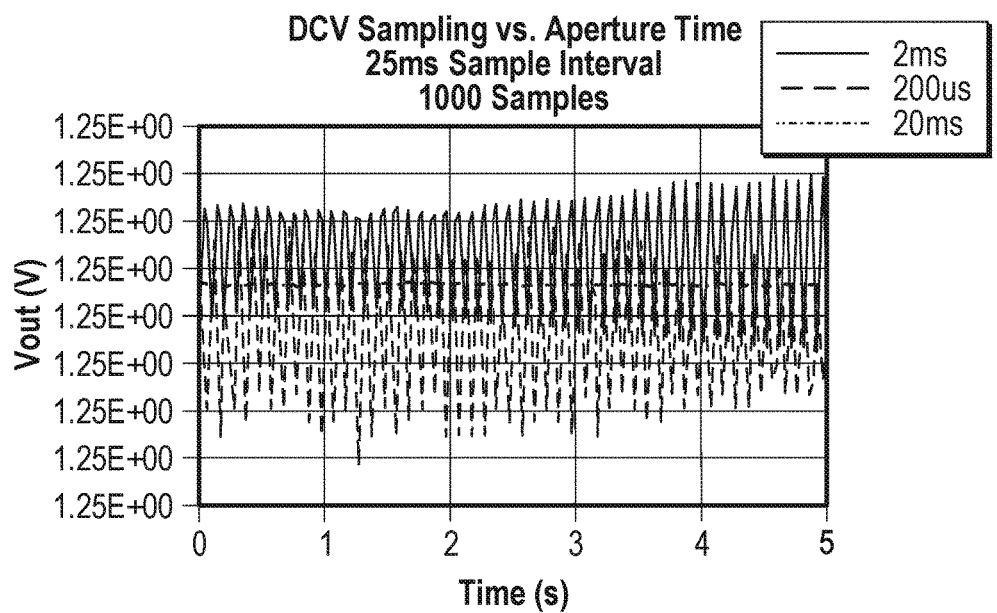
FIGS. 8A and 8B illustrate generally an impact of aperture duration on resulting DAC output voltage measurements.
Figure 8B:
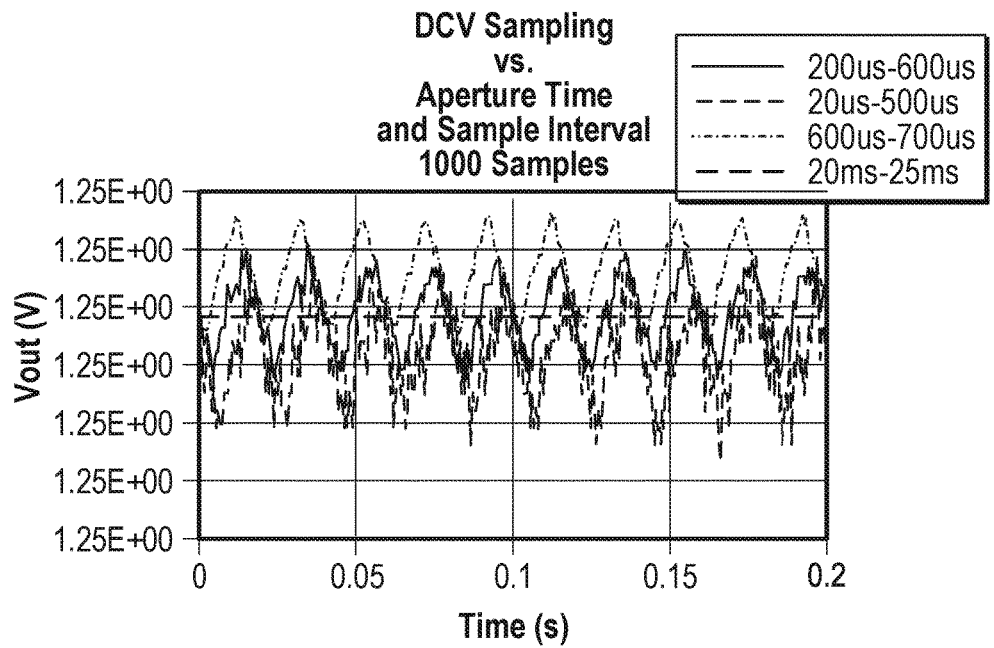

FIGS. 8A and 8B illustrate generally an impact of aperture duration on resulting DAC output voltage measurements, for an approach where offset voltage is measured in response to a sequence of events resulting in output transients. In FIG. 8A, the integration duration is fixed at 25 ms. In FIG. 8B, the aperture duration ("aperture time") and integration duration ("sample interval") are both varied. In both FIG. 8A and FIG. 8B, if an aperture less than 20 ms in duration is used, power line noise effects can create measurement errors (particularly where an AC line-powered measurement instrument, such as a DMM, is used for performing output offset measurement). Such noise can appear as time-varying waveforms super-imposed on the offset value corresponding to the glitch behavior. Selection of appropriate measurement parameters for integration can be used to suppress power line noise effects (e.g., such as using a sampling aperture corresponding to an integral number of power line cycles).

FIG. 9 illustrates generally plots of frequency spectra associated a presence and absence of glitch events. FIG. 9 shows generally that in the frequency domain, energy associated with the glitch behavior can be visualized and may include predominantly low frequency components. The spectra shown in FIG. 9 were obtained by transforming digitized glitch waveforms to the frequency domain and averaging spectra corresponding to the DAC output without glitch behavior (labeled "Vout without glitch") and in the presence of glitch behavior (labeled "Vout with glitch").

Figure 10:
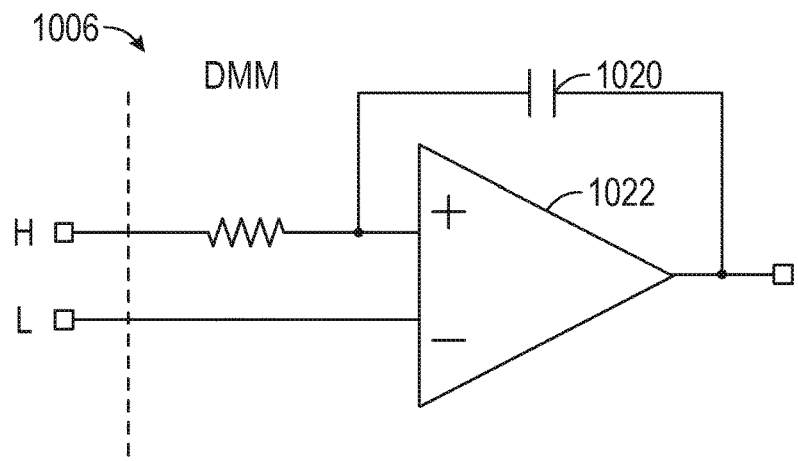
FIG. 10 illustrates generally an example of a circuit that can provide a hardware-based integrator, such as can be included as a portion of a DMM.
Figure 11:
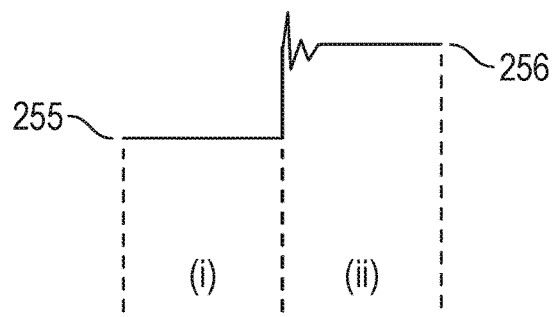
FIG. 11 illustrates generally an illustrative example of an output step between two DAC circuit codes (i) and (ii), such as corresponding to a shift from a code value of 255 to a code value of 256.
Figure 12:
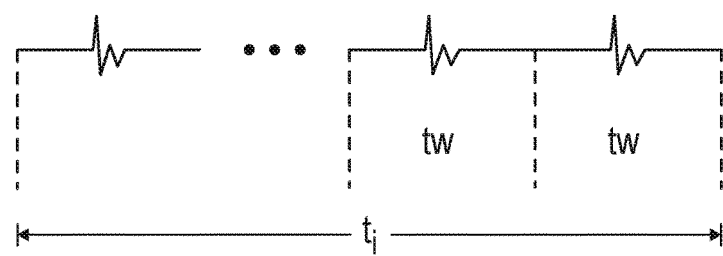
FIG. 12 illustrates generally an illustrative example of a sequence of similar DAC circuit output glitches, such as having individual glitches repeated at a write interval, $t_w$, and integrated over an integration duration, $t_i$.

Measurements, such as those shown illustratively in the plots discussed above, can be obtained using a DMM configured to provide a hardware-based integrator circuit. Such a circuit can also be included as a portion of an integrated circuit to provide on-chip characterization or compensation of offset caused by glitch behavior. For example, FIG. 10 illustrates generally an example of a circuit that can provide a hardware-based integrator 1006, such as can be included as a portion of a DMM or implemented on-chip. The integrator can include a difference amplifier circuit 1022 with "high" (H) and "low" (L) differential inputs, and a storage element such as a capacitor 1020. FIG. 11 illustrates generally an illustrative example of an output step between two DAC circuit codes (i) and (ii), such as corresponding to a shift from a code value of 255 to a code value of 256. If a glitch area associated with the code-value change in FIG. 11 is to be measured, a problem can exist in returning the DAC circuit to the initial code (i) so that the same glitch even can be measured again, such as for purposes of averaging. Ideally, a sequence of similar glitches could be integrated as shown in FIG. 12, such as in response to a sequence of input events. FIG. 12 illustrates generally that a sequence of similar DAC circuit output glitches can be elicited, for characterization, such as having individual glitches repeated at a write interval, $t_w$, and integrated over an integration duration, $t_i$.

Figure 13A:
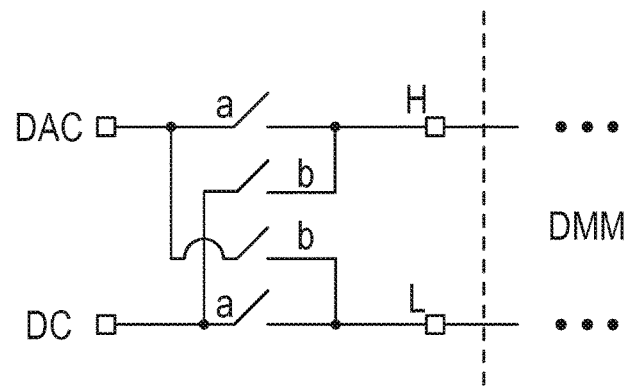
FIG. 13A illustrates generally a representation of a switch circuit that can be used when the integration is being performed using an integrator circuit having a differential input, such as can be included as a portion of a DMM.
Figure 13B:
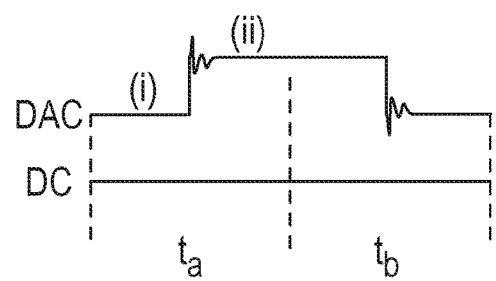
FIG. 13B illustrates generally an illustrative example of a sequence of states where a DAC circuit output can be cycled between the first and second codes (i) and (ii) and returned back to the first code (i).

FIG. 13A illustrates generally a representation of a switch circuit that can be used when the integration is being performed using an integrator circuit having a differential input, such as can be included as a portion of a DMM or implemented on-chip. FIG. 13B illustrates generally an illustrative example of a sequence of states where a DAC circuit output can be cycled between the first and second codes (i) and (ii) and returned back to the first code (i). If repeating cycles of durations $t_a$ and $t_b$ are integrated, such as by presenting a DAC output to the high terminal H of a DMM or other measurement circuit, and a specified DC value to the low terminal L, the integration result provides a sum of the DC difference between the DAC output at the high terminal and the DC value, which corresponds to half the DC step between (i) and (ii) if an overall 50% duty cycle was realized over the integration period, and the difference in glitch area as contributed from the DAC glitch from the rising step and falling step. Such a measurement has generally not recovered sufficient information that informs about the magnitude of the DAC glitch. However, information about a difference (due to non-symmetry) between the rising DAC step (code (i) to code (ii)) and falling DAC step update glitches is contained within such an integration. Extracting such asymmetry would still involve further measurements to find the DC difference between the terminals and the DAC step size.

In one approach, a DC difference between the H and L terminals and the DAC step DC value could be known to sufficient accuracy prior to the integration that half this step value could be subtracted from the integration result. For example, accurate measurements of DAC output step values can be obtained during electrical test in production or verification, and such results could be used in conjunction with glitch measurements to obtain glitch area estimates or output offset estimates.

In another approach, the DC difference between the H and L terminals need not be known from separate DAC output measurements and such information can be recovered using a sequence of integration measurements and appropriate switching circuitry. For example, FIG. 13A illustrates generally a representation of a switch circuit as mentioned above. Using the switch circuit, a step up and step down in DC values associated with the sequence of states shown in FIG. 13B can be canceled. For example, an integration period can begin with a duration, $t_a$, where the DAC output is connected to the H terminal and a DC value to the L terminal (corresponding to switches labeled "a" being closed in FIG. 13A). At the end of the duration $t_a$ where the DAC was transitioned from code (i) to (ii) at time $t_a/2$, the inputs to the DMM can be switched so that the DAC output is now presented to the L terminal and DC value to the H terminal (corresponding to switches labeled "B" being closed). At time $t_b/2$ the DAC steps from code (ii) back to (i). At the end of duration $t_b$ the inputs are switched back and a new $t_a$ period begins. The overall integration duration is generally an integer number of $t_a$ and $t_b$ period pairs.

The switching of the terminals during the integration duration generally results in the measurement circuit (e.g., DMM or on-chip integrator circuit) rejecting a DC difference between the H and L terminals, because the DC difference between the H and L terminals have contributed equal amounts of run-up and run-down time on the integrating capacitor. This is also true of the DC value contributed by the DAC step (or ramp) between states (i) and (ii). A digital feedthrough glitch associated with the DAC write is also generally rejected because an equal number of replicate glitches have been presented to both the H and L terminals during the overall integration duration. The stimulus that does contribute net charge to the integrating capacitor is the DAC glitch.

Figure 13C:
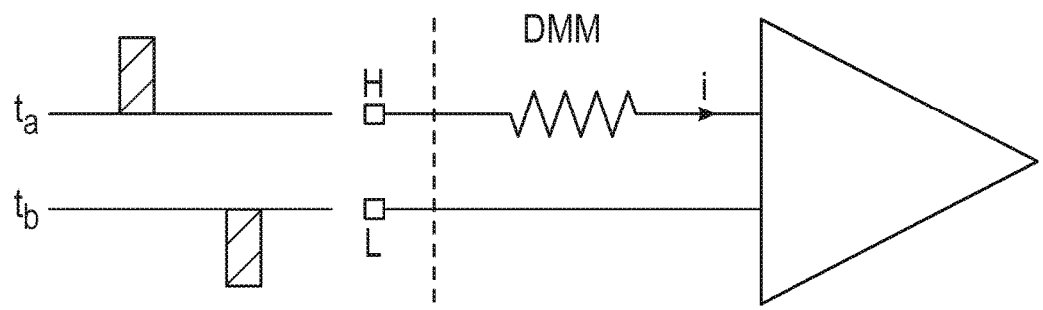
FIG. 13C illustrates generally that an increase in voltage across the resistance of an input to an integrator circuit (where "i" represents an integration charge) can be achieved by increasing $V_H$ with respect to $V_L$ or by decreasing $V_L$ with respect to $V_H$.
Figure 13D:
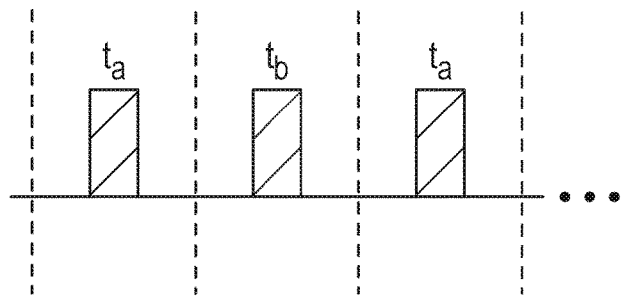
FIG. 13D illustrates generally an illustrative example of an equivalent waveform to be integrated, such as corresponding to the inputs shown in FIG. 13C, and as can be provided at the inputs of the integrator circuit using a switching network as shown in FIG. 13A.

FIG. 13C illustrates generally that an increase in voltage across the resistance of an input to an integrator circuit (where "i" represents an integration charge) can be achieved by increasing $V_H$ with respect to $V_L$ or by decreasing $V_L$ with respect to $V_H$. Both such cases occur for the DAC glitch contribution during the integration period as shown by the shaded blocks in FIG. 13C. Accordingly, an equivalent integrated waveform can be represented by FIG. 13D, with the glitch contributions represented by the shaded block areas. FIG. 13D illustrates generally an illustrative example of an equivalent waveform to be integrated, such as corresponding to the inputs shown in FIG. 13C, and as can be provided at the inputs of the integrator circuit using a switching network as shown in FIG. 13A.

Figure 13E:
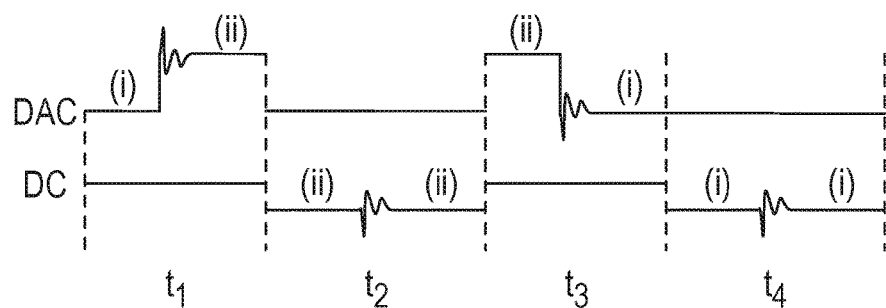
FIG. 13E illustrates generally a sequence of states that can be used recover positive-going and negative-going glitch area contributions independently, such as using a variation of the same general input switching scheme as shown in FIG. 13A.

FIG. 13E illustrates generally a sequence of states that can be used recover positive-going and negative-going glitch area contributions independently, such as using a variation of the same general input switching scheme as shown in FIG. 13A. The technique described above with respect to FIG. 13B, FIG. 13C, and FIG. 13D generally provides an average absolute glitch area, which can be referred to as a "sum" term. The positive-going and negative-going glitch areas are not independently recovered using such a "sum" technique, alone. However, the respective positive and negative going glitch areas can be recovered independently, such as using a variation of the same general switching input technique as shown in FIG. 13E. In this manner, a DC difference between the DC value and DAC output value, the DAC step (or ramp), and the digital feedthrough can all be rejected.

Referring to FIG. 13E, duration $t_1$ can be the same as duration $t_a$ mentioned above, where the DAC transitions from code (i) to code (ii). The inputs to the measurement circuit (e.g., DMM or integrator circuit) are switched for duration $t_2$, and the DAC output can be presented to the L terminal. During $t_2$, the DAC can receive a write pattern that generates digital feedthrough but where the DAC output remains at code (ii). Switching the inputs again for $t_3$ can present the DAC output back to the H terminal where it is transitioned with a write again back to code (i). The $t_4$ duration completes the sequence where, similar to $t_2$, the DAC receives a digital write but remains at code (i). This 4-cycle pattern can be repeated an integer number of times during an overall integration duration. In this example, code (i) and code (ii) present for equal time on both inputs, and the same is generally true of the DC difference between the DAC and DC value, and equal numbers of replicate feedthrough glitch events appear on both terminals. In this manner, a "difference" term can be measured. The rising glitch net integration can be represented as ((difference+sum)/2), and the falling glitch net integration is the rising glitch value minus the sum value.

Generally, the techniques described above using integration and a switched input circuit can provide one or more of the following characteristics: independent evaluation of DAC output rising update glitch and falling update glitch; a variable integration duration for both the sum and difference integration measurements can be traded versus a desired measurement accuracy; a DC difference between the DAC at H terminal and the DC value at the L terminal can be rejected; DAC step or ramp behavior can be rejected, DC drift at either of the measurement circuit inputs can be cancelled; and power line (e.g., mains) noise can be rejected.

Figure 13F:
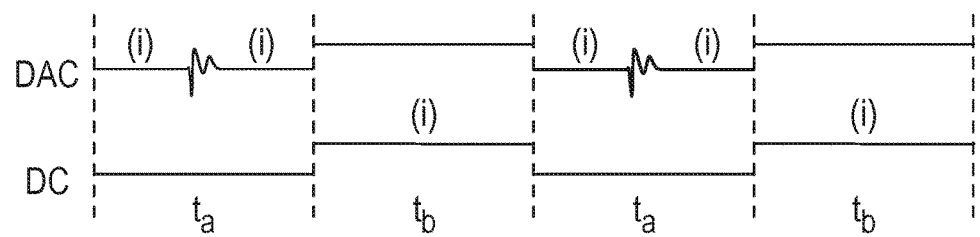
FIG. 13F illustrates generally another sequence of states that can be used to reject a difference between a DAC output and a DC difference while recovering and integrating a contribution from a digital feedthrough effect.

FIG. 13F illustrates generally another sequence of states that can be used to reject a difference between a DAC output and a DC difference while recovering and integrating a contribution from a digital feedthrough effect. While generally lesser in magnitude than sample-and-hold or DAC output level change glitch behavior, glitch impulses from digital feedthrough can also present an unwanted artifact during communication transactions with the DAC circuit. For example, digital feedthrough can occur during communication with a DAC integrated circuit over a serial interface (e.g., an SPI interface). Also, for example, a sample-and-hold circuit used for make-break cycling and internal DAC circuit operation can also cause unwanted artifacts during the hold period such as contributing to net glitch area. These artifacts can also be characterized using an integration technique. For example, as shown in FIG. 13F, the switching scheme of FIG. 13A can be used, such as to reject a difference between the DAC output and the DC difference while recovering and integrating a contribution from the digital feedthrough effect. For example, in FIG. 13F, a scheme can be used where the DAC output in $t_a$ durations has a digital feedthrough event but no code change, and in the switched $t_b$ durations, feedthrough is suppressed. This leads to the net contribution from replicate feedthrough events while rejecting a DC difference between the inputs.

The event sequences mentioned above are illustrative, and other event sequences can be used to capture glitch phenomena using an integrator circuit, such as for characterization or compensation. The techniques mentioned above can be implemented using a variety of different circuit topologies. In an example, a portion or an entirety of one or more techniques described herein can be implemented on-chip in an integrated circuit including the DAC circuit. For example, a resistance-based DAC circuit can include redundancy to reduce a glitch effect. A decoding engine can be used to reduce or minimize a count of legs transitioning in the DAC, such as using a segmented dual R2R topology.

Figures 14A, 14B:
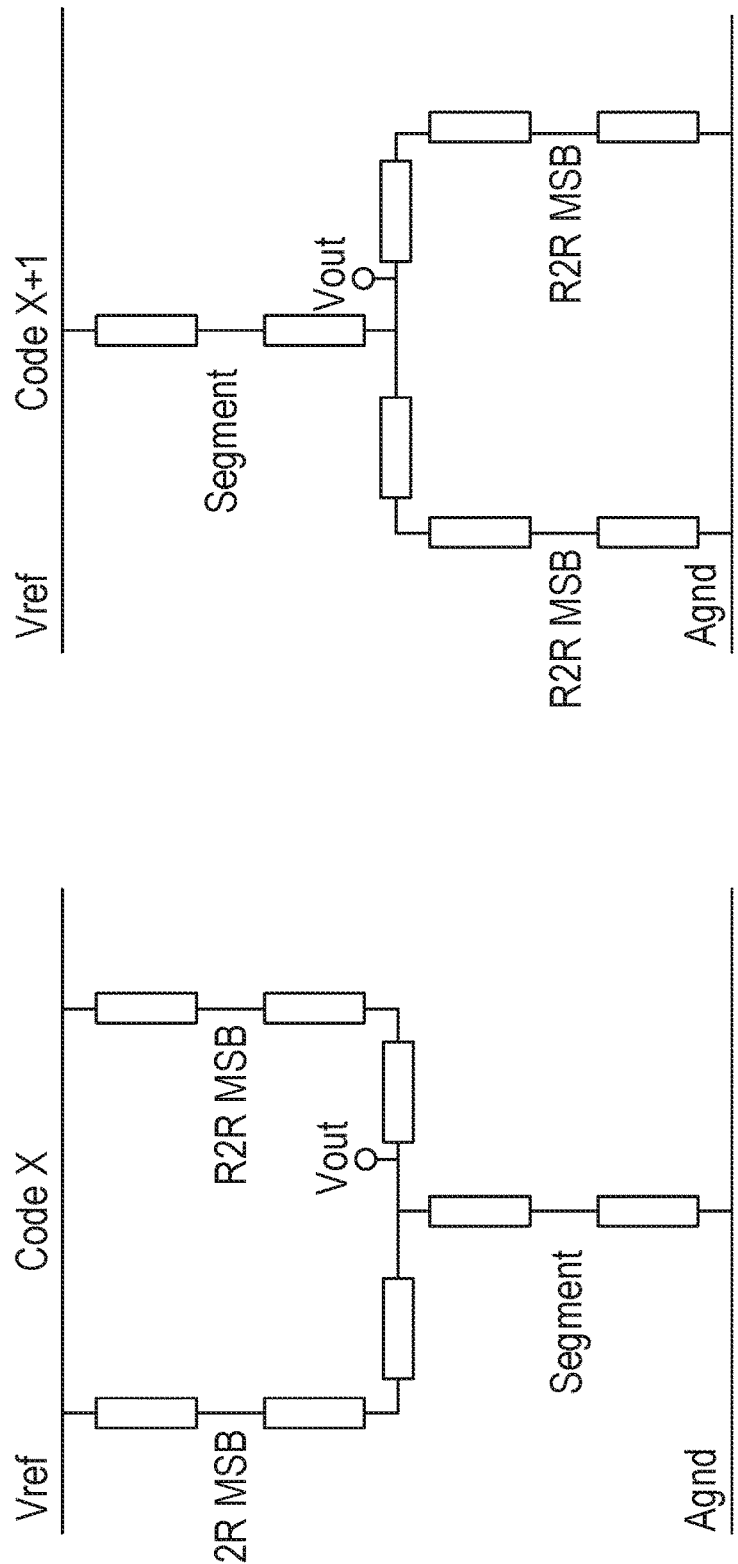
FIG. 14A illustrates generally an illustrative example of a portion of an integrated circuit, such as comprising a resistance-based DAC circuit including redundancy, and corresponding to a first output state, represented as code "X."
FIG. 14B illustrates generally an illustrative example of a portion of the integrated circuit of FIG. 14A, corresponding to a second output state, represented as code "X+1."

FIG. 14A illustrates generally an illustrative example of a portion of an integrated circuit, such as comprising a resistance-based DAC circuit including redundancy, and corresponding to a first output state, represented as code "X," and FIG. 14B illustrates generally an illustrative example of a portion of the integrated circuit of FIG. 14A, corresponding to a second output state, represented as code "X+1." The segment branch is transitioned from a connection to an analog reference represented by Agnd, to a node represented by Vref. A significant glitch event can occur when a segment transition occurs. However, in a DAC including a redundant configuration, a DC output level change does not need to occur during a segment transition. In this manner, a glitch contribution from the segment transition can be characterized, such as shown using a sequence of states as illustrated generally in FIG. 15A, and as can be measured using a circuit configuration as shown in FIG. 15B.

FIG. 15A illustrates generally a sequence of states that can be used recover positive-going and negative-going glitch area contributions, such as corresponding to the two states shown illustratively in FIG. 14A and FIG. 14B, and a measurement configuration including a comparator circuit is shown illustratively in FIG. 15B. A difference in area of the upward-going and downward-going glitches can be averaged by the capacitor of the circuit 1500 of FIG. 15B, resulting in a DC offset at an input of the comparator. In a redundant DAC circuit, LSB contributions can be added to the DAC output node, such as to determine a count of how many LSB contributions are needed to trip the comparator output (including fractional LSB contributions if available). Counts of LSBs can be determined for different measurement scenarios, such as for a DAC output lacking a DC output transition, and a resistor switching signal. A resulting difference between the counts gives a representation of a difference between rising and falling glitch values in terms of an LSB count representing the glitch asymmetry.

FIG. 16A illustrates generally a sequence of states that can be used recover positive-going and negative-going glitch area contributions, such as corresponding to the two states shown illustratively in FIG. 14A and FIG. 14B, and a differential measurement configuration including a comparator circuit is shown illustratively in FIG. 16B. As shown in FIG. 16B, input switches can be used, and the upward-going (e.g., rising) glitches can be coupled to the first comparator input, and the negative-going (e.g., falling) glitches can be coupled to the second comparator input. The difference between the DC values at the two comparator input terminals can represent a sum of the absolute values of the rising and falling glitches. As in the example above in FIG. 15A and FIG. 15B, in a redundant DAC circuit, LSB contributions can then be added to a comparator input, such as to determine another count of how many LSB contributions are needed to trip to the comparator output. The count gives a representation of the sum of the rising and falling glitch values. The individual rising and falling glitch offsets can then be extracted from the sum and difference values. As an example, the rising glitch can be represented by a value of (difference+sum)/2 and the falling glitch can be represented by a value of (rising glitch−sum). Corresponding rising and falling glitch areas can be determined, such as for characterization or for compensation.

Figure 17:
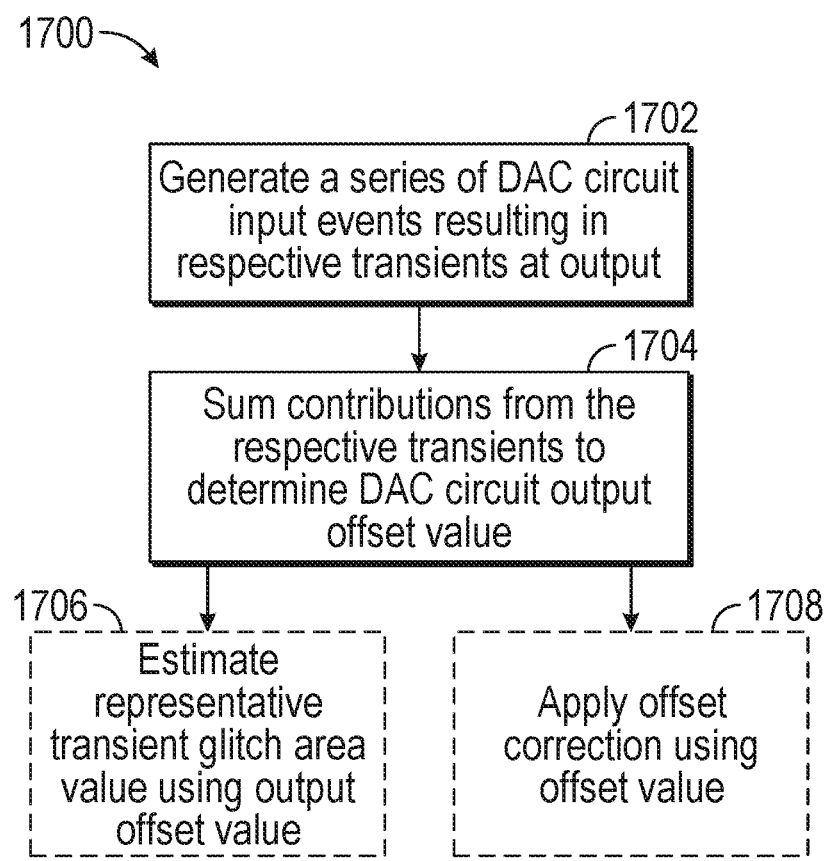
FIG. 17 illustrates generally a technique, such as a method, that can be performed using an integrated DAC circuit, or using a measurement circuit coupled to an integrated DAC circuit.

FIG. 17 illustrates generally a technique 1700, such as a method, that can be performed using an integrated DAC circuit, or using a measurement circuit coupled to an integrated DAC circuit. At 1702, a series of DAC circuit input events can be generated resulting in respective transients at the DAC circuit output. As mentioned elsewhere herein, such transients can include glitch behavior related to digital feedthrough, sample-and-hold (S&H) behavior, segment transition, or other behavior. Through selection of the event sequence and measurement configuration, transient effects at the DAC circuit output caused by digital feedthrough or S&H behavior can be suppressed or isolated from other effects such as segment transitions or output level changes. At 1704, contributions from the respective transients can be summed, such as using a hardware-based integrator circuit, to determine an offset value corresponding to the event sequence or measurement being performed. The offset value can be provided as an analog voltage, a value corresponding to an analog voltage, or a value corresponding to a count, such as a count representing an integer or fractional representation of LSB values corresponding to the offset. At 1706, optionally, a glitch area can be estimated using the offset value and other information, such as information indicative of the DAC output update rate (e.g., update repetition rate) corresponding to the offset value measurement. At 1708, optionally, an offset correction can be applied such as to cancel or otherwise compensate for an unwanted output offset caused by the glitch behavior.

VARIOUS NOTES

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for characterizing transient behavior associated with a digital-to-analog converter (DAC) circuit, the method comprising:
   receiving, at an input of the DAC circuit, a first input event followed by a second input event resulting in a first transient followed by a second transient at an output of the DAC circuit; and
   summing a first contribution from the first transient that resulted from the first input event with a second contribution from the second transient that resulted from the second input event to determine a DAC circuit output offset value representative of the first and second transients.

2. The method of claim 1, further comprising generating the first and second input events at a specified repetition rate; and
   wherein the DAC circuit output offset value corresponds to the specified repetition rate.

3. The method of claim 2, comprising estimating a representative transient glitch area value using the output offset value.

4. The method of claim 2, wherein the first and second input events comprise first and second DAC circuit register writes.

5. The method of claim 4, wherein the DAC circuit register writes comprise a DAC circuit output update lacking an output level shift.

6. The method of claim 4, wherein the DAC circuit register writes comprise a DAC circuit output update including a direct-current (DC) value step-change in the DAC circuit output.

7. The method of claim 6, wherein the DAC circuit register writes comprise output updates including a first-polarity DC value step-change during a first period and a second, opposite-polarity DC value step-change during a second period.

8. The method of claim 7, wherein the first and second contributions are summed using an integrator circuit, further comprising swapping an input polarity to the integrator circuit such that a first input polarity is used during the first period and a second, opposite input polarity is used during the second period.

9. The method of claim 1, wherein the first and second input events comprises first and second DAC circuit register writes including a first portion of register writes associated with DAC circuit output update commands and a second portion of register writes without associated DAC circuit output update commands; and
   wherein the method comprises removing a baseline contribution to the output offset value corresponding to the DAC circuit register writes without associated output update commands, to determine an output offset value corresponding to DAC circuit output update events.

10. The method of claim 1, wherein the first and second contributions are summed using an integrator circuit,
   wherein the integrator circuit is located within a commonly-shared integrated circuit comprising the DAC circuit; and
   wherein the method comprises comparing the output offset value representative of the first and second transients to a specified threshold to determine an output offset value in terms of a count of least-significant bit (LSB) contributions; further comprising
   applying an offset compensation corresponding to the count.

11. The method of claim 10, wherein the offset compensation is applied using at least one fractional LSB contribution.

12. A digital-to-analog converter (DAC) circuit, comprising:
an input configured to receive a first digital input followed by a second digital input configured to trigger a first transient followed by a second transient at an analog output of the DAC;
a circuit configured to sum a first contribution from the first transient that was triggered from the first digital input with a second contribution from the second transient that was triggered from the second digital input to determine a DAC circuit output offset value representative of the first and second transients; and
an offset compensation circuit configured to apply an offset compensation to the analog output corresponding to the determined DAC circuit output offset value.

13. The DAC circuit of claim 12, wherein the circuit configured to sum the first and second contributions comprises an integrator circuit, wherein the integrator circuit comprises a capacitor; and
wherein the offset compensation circuit comprises a comparator circuit including an input coupled to the capacitor, the comparator circuit arranged to compare the DAC circuit output offset value as represented by a voltage on the capacitor to a specified threshold to determine the output offset value; and
wherein the DAC circuit is configured to apply the offset compensation in response to an output of the comparator circuit.

14. The DAC circuit of claim 13, wherein an output circuit configuration of the DAC circuit comprises a redundant architecture; and
wherein the DAC circuit is configured to apply offset compensation using an output contribution provided by a redundant element in the redundant architecture.

15. The DAC circuit of claim 14, wherein the redundant element comprises a fractional LSB contribution.

16. The DAC circuit of claim 12, wherein the first and second digital inputs are received at a specified repetition rate; and
wherein the DAC circuit output offset value corresponds to the specified repetition rate.

17. The DAC circuit of claim 13, wherein the first and second digital inputs comprise first and second DAC circuit register writes.

18. The DAC circuit of claim 13, wherein the DAC circuit register writes comprise output updates including a first-polarity DC value step-change during a first period and a second, opposite-polarity DC value step-change during a second period.

19. The DAC circuit of claim 13, comprising a switching circuit to swap an input polarity to the integrator circuit such that a first input polarity is used during the first period and a second, opposite input polarity is used during the second period.

20. An apparatus for characterizing transient behavior associated with a digital-to-analog converter (DAC) circuit, the apparatus including:
circuitry for generating a series of DAC circuit input events resulting in respective transients at an output of the DAC circuit; and
circuitry for summing contributions from the respective transients to determine a DAC circuit output offset value representative of the transients;
wherein the circuitry for generating the series of events is configured to generate such events at a specified repetition rate; and
wherein the DAC circuit output offset value corresponds to the specified repetition rate.

21. A method for characterizing transient behavior associated with a digital-to-analog converter (DAC) circuit, the method including:
generating a series of DAC circuit input events resulting in respective transients at an output of the DAC circuit; and
summing contributions from the respective transients to determine a DAC circuit output offset value representative of the transients;
wherein the series of events are generated at a specified repetition rate; and
wherein the DAC circuit output offset value corresponds to the specified repetition rate.

22. The method of claim 1, wherein the first transient comprises a rising glitch and the second transient comprises a falling glitch, further comprising:
coupling the rising glitch to a first input of a comparator;
coupling the falling glitch to a second input of the comparator; and
computing, using the comparator, the DAC circuit output offset value based on a difference between the first and second inputs of the comparator, the difference representing a sum of absolute values of the rising and falling glitches.

23. The method of claim 1, wherein the first and second contributions are summed using an integrator circuit.

24. The method of claim 1, wherein the second input event is received sequentially after the first input event.

25. The DAC circuit of claim 12, wherein the first transient comprises a rising glitch and the second transient comprises a falling glitch, further comprising a comparator configured to:
receive the rising glitch at a first input of the comparator;
receive the falling glitch at a second input of the comparator; and
compute the DAC circuit output offset value based on a difference between the first and second inputs of the comparator, the difference representing a sum of absolute values of the rising and falling glitches.

26. The DAC circuit of claim 12, wherein the circuit configured to sum the first and. second contributions comprises an integrator circuit.

27. The DAC circuit of claim 12, wherein the second digital input is received sequentially after the first digital input.

28. The apparatus of claim 20, wherein the circuitry for summing the contributions comprises an integrator circuit.

29. The method of claim 21, wherein the contributions are summed using an integrator circuit.

* * * * *

UNITED STATES PATENT AND TRADEMARK OFFICE
CERTIFICATE OF CORRECTION

PATENT NO. : 10,200,055 B2
APPLICATION NO. : 15/863313
DATED : February 5, 2019
INVENTOR(S) : Enright et al.

Page 1 of 1

It is certified that error appears in the above-identified patent and that said Letters Patent is hereby corrected as shown below:

In the Claims

In Column 14, Line 65, in Claim 10, delete "contributions; further comprising" and insert --contributions, further comprising;-- therefor In Column 16, Line 51, in Claim 26, delete "and." and insert --and-- therefor Signed and Sealed this
Twenty-first Day of April, 2020

Andrei Iancu
*Director of the United States Patent and Trademark Office*